(12) United States Patent
Lin

(10) Patent No.: US 7,243,273 B2
(45) Date of Patent: Jul. 10, 2007

(54) MEMORY TESTING DEVICE AND METHOD

(75) Inventor: Wen-Hsi Lin, Hsinchu (TW)

(73) Assignee: Macroni x International Co., Ltd., Hsinchu (TW)

( * ) Notice: Subject to any disclaimer, the term of this patent is extended or adjusted under 35 U.S.C. 154(b) by 383 days.

(21) Appl. No.: 10/172,454

(22) Filed: Jun. 13, 2002

(65) Prior Publication Data

US 2003/0204797 A1 Oct. 30, 2003

Related U.S. Application Data

(63) Continuation-in-part of application No. 10/128,895, filed on Apr. 24, 2002.

(51) Int. Cl.
G11C 29/00 (2006.01)
G01R 31/28 (2006.01)
G06F 11/00 (2006.01)

(52) U.S. Cl. .................... 714/718; 714/736; 365/201

(58) Field of Classification Search ................ 714/718, 714/719, 720, 736, 738; 702/117; 365/201, 365/230.03
See application file for complete search history.

(56) References Cited

U.S. PATENT DOCUMENTS

| 5,587,950 | A | * | 12/1996 | Sawada et al. ............. 365/201 |
| 6,173,238 | B1 | | 1/2001 | Fujisaki |
| 6,243,422 | B1 | * | 6/2001 | Urabe et al. ................ 375/259 |
| 6,361,501 | B1 | * | 3/2002 | Amano et al. .............. 600/500 |
| 6,543,015 | B1 | * | 4/2003 | Wang et al. ................ 714/718 |
| 6,877,118 | B2 | * | 4/2005 | Oshima et al. ............. 714/719 |

* cited by examiner

*Primary Examiner*—Phung My Chung
(74) *Attorney, Agent, or Firm*—Stout, Uxa, Buyan & Mullins, LLP (57) ABSTRACT

A memory testing apparatus rapidly tests memory devices with a relatively small error catch memory. The memory testing apparatus provides an address compressing module that minimizes an amount of error catch memory necessary to test one or more memory devices. The memory testing apparatus further divides each of the memory devices into a plurality of areas, and tests each area sequentially until a bit failure is detected in the area thereby attenuating testing time.

30 Claims, 8 Drawing Sheets

MEMORY TESTING DEVICE AND METHOD

RELATED APPLICATION DATA

This application is a continuation-in-part of U.S. application Ser. No. 10/128,895, filed Apr. 24, 2002, and entitled Serial Input/Output Testing Method, which is commonly assigned and the contents of which are expressly incorporated herein by reference.

BACKGROUND OF THE INVENTION

1. Field of the Invention

The present invention relates generally to testing devices and, more particularly, to memory testing devices and methods.

2. Description of Related Art

In the era of very large scale integrated (VLSI) circuits, the trend in the fabrication of memory devices has been to construct increasingly larger memory arrays onto constant or smaller sized die (semiconductor chips). It is common for a certain percentage of the memory cells in a memory device to be faulty. To account for this, memory devices can be constructed with a core memory comprising a large number of memory cells, and a peripheral redundant memory whose memory cells can be substituted for failed memory cells from the core memory. Memory devices are tested to determine which memory cells are defective, and therefore which memory cells from the core memory need to be replaced by memory cells from the peripheral redundant memory. Unfortunately, the difficulty of testing the memory devices increases as the number of elements on a chip grows, requiring greater amounts of resources and time.

The fabrication of today's dense VLSI memory arrays dictates that a significant portion of the manufacturing process be spent testing the memory arrays. In response, tester manufacturers have created automated testing systems that simultaneously test multiple memory devices. Tests can be performed on the memory device after fabrication while still on the silicon wafer, after being packaged as a chip, or at both times.

Memory testers used on multiple memory devices typically introduce tests on the memory devices and compare outputs from the memory devices with standard or expected values. Robotic machinery can be used to places memory chips on a test board, and to initiate electrical contact between the memory devices and the external circuitry of the memory tester. A memory tester's external circuitry is typically designed in terms of modules, with each module corresponding to a terminal of the memory device. During a test, each separate module can send data, receive data, remain idle, or perform other tasks.

Tests are executed by the exchange of signals between the memory tester and the memory device or devices. To test a memory device, address signals can be generated and fed from the tester to the memory device's input address pins, and subsequently test data input signals can be fed to the memory device's input data pins. The data input signals, once applied to the memory device, are routed to respective memory segments within the memory device before an output is advanced from the memory device. This output, when compared to a standard by the memory tester, indicates whether a selected memory cell of the memory device is operating properly.

Test signals must be able to test memory devices at their maximum operational speed, and must have a failure analysis memory large enough to record the state of each memory cell of each attached memory device. Therefore the failure analysis memory is conventionally constructed to be as large as the sum of all of the memory devices being tested, and each memory cell is tested. The failure analysis memory can cost as much as 30% of the total cost of a single testing apparatus. Thus, it is desirable to be able to reduce the amount of error catch memory needed to test a plurality of memory devices.

SUMMARY OF THE INVENTION

The present invention may reduce the restrictive cost of memory testing apparatuses by providing, in accordance with one aspect of the present invention, a memory testing apparatus having an address compressing module. The address compressing module compresses the address signal for writing to an error catch memory. The compressed address signal (compressed address) points to, for example, one bit of the error catch memory. Therefore, when a comparing module detects a memory area fail, a comparing result is stored in one bit according to the compressed address of the error catch memory. Thus, the size of the error catch memory can be reduced.

The present invention may further reduce costs of memory testing apparatuses by providing, in accordance with an aspect of the present invention, a memory testing apparatus that divides the memory under test (MUT) into a plurality of areas, and tests each area successively. If one of the data bits in an area is faulty (a detected mismatch), the comparing module stops testing (comparing) data in that area, so that the residual bits in that area are not tested. This division of the MUT into a plurality of areas can act to reduce the testing time required for each MUT.

The different embodiments of the invention may include one or more of the following objectives, but may not necessarily include them all. One objective of the invention is to provide a memory testing apparatus and method for efficiently testing a memory device with a large memory capacity. Another objective is to provide a memory testing apparatus and method for reducing testing time. Another objective is to provide a memory testing apparatus that reduces the tester onboard memory requirements for storing locations of defective memory cells.

To achieve these and other advantages in accordance with the present invention, as embodied and broadly described herein, the invention provides a memory testing apparatus for testing at least one memory device, comprising: (a) a pattern-generating module for generating and outputting an address signal and an expected value; (b) a waveform-shaping module for generating a test signal according to the address signal and outputting the test signal to the memory device; (c) a comparing module for comparing the expected value with an output signal from the memory device according to the test signal, and outputting a comparison result; (d) an address-compressing module for generating a compressed address for the result; and (e) an error catch memory for recording the comparison result in a memory location according to the compressed address.

The address signal may point to an area of the memory device, which may comprise, for example, a column area, a row area, or a block area. An expected value may comprise a data signal, and the pattern-generating module may further generate a control signal. Accordingly, the test signal may further comprise information from the data signal and the control signal. When an expected value and a corresponding output signal are mismatched, the comparing module may stop comparing the area of the memory device and output a "fail" result, while when an expected value and a corresponding output signal are matched, the comparing module may output a "pass" result. Upon a mismatch, the comparing result is stored in the compressed address of the error catch memory.

The at least one memory device may comprise a plurality of memory devices, and the pattern-generating module may generate and output a plurality of address signals and a plurality of expected values, wherein each of the plurality of address signals can point to one area of a corresponding memory device. A plurality of test signals can be generated by the waveform-shaping module according to the plurality of address signals, and each of the plurality of test signals can be output to a corresponding member of the plurality of memory devices. The comparing module may then compare a corresponding expected value with a corresponding output signal from the corresponding memory device according to the corresponding test signal, and output a plurality of results. The address-compressing module may generate a plurality of compressed addresses for the results, and the error catch memory may record information pertaining to the comparison results in a plurality of memory locations according to the plurality of compressed addresses.

In another embodiment, the present invention provides a memory testing method for testing at least one memory device, comprising: (a) generating an address signal; (b) generating a test signal according to the address signal; (c) outputting the test signal to the memory device; (d) comparing an expected value with an output signal received from the memory device, and outputting a comparison result; (e) generating a compressed address of an error catch memory for the comparing result; and (f) recording information pertaining to the result in the compressed address of the error catch memory.

The method may further provide a step of generating an address signal that points to an area of the at least one memory device, wherein the address signal is included in the test signal. The compressed address may point to one bit of the error catch memory. The method may also provide the steps of: (a) when an expected value and a corresponding output signal are mismatched, the comparing of the expected value and the output signal is stopped and the result is a "fail," and (b) when the expected value and the corresponding output signal are matched, the result is a "pass."

The memory testing method may also be simultaneously performed on a plurality of memory devices. When a plurality of memory devices are tested, the memory testing method can comprise: (a) generating a plurality of address signals; (b) generating a plurality of test signals from the plurality of address signals; (c) outputting the plurality of test signals to the plurality of memory devices; (d) comparing output signals received from the plurality of memory devices with expected values, and outputting a plurality of comparison results; (e) generating a plurality of compressed addresses for at least a portion of the results; and (f) recording the plurality of comparison results in a plurality of memory locations according to the corresponding plurality of compressed addresses. When testing a plurality of memory devices in parallel, the memory testing method may also further comprise the steps of: (I) detecting the number of attached memory devices; and (II) synchronizing the plurality of attached memory devices.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

FIG. 4aa is a device diagram of a redundancy column device corresponding to FIG. 4a;

FIG. 4bb is a device diagram of a redundancy row device corresponding to FIG. 4b;

FIG. 4cc is a device diagram of a redundancy block device corresponding to FIG. 4c;

FIG. 5a is a block diagram illustrating a cell row of an error catch memory, corresponding to the memory device of FIG. 4a;

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same reference numbers are used in the drawings and the description to refer to the same or like parts. It should be noted that the drawings are in greatly simplified form, are not inclusive, and are not to precise scale. In reference to the disclosure herein, for purposes of convenience and clarity only, directional terms, such as, top, bottom, left, right, up, down, above, below, beneath, rear, and front, may be used with respect to the accompanying drawings. Such directional term should not be construed to limit the scope of the invention in any manner.

Although the disclosure herein refers to certain illustrated embodiments, it is understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture, operation, and testing of memory devices and memory testing systems. The present invention can be practiced in conjunction with various integrated circuit memory testing devices and techniques that are used in the art, and only so much of the commonly practiced structures and process steps are included herein as are necessary to provide an understanding of the present invention.

Figure 1:
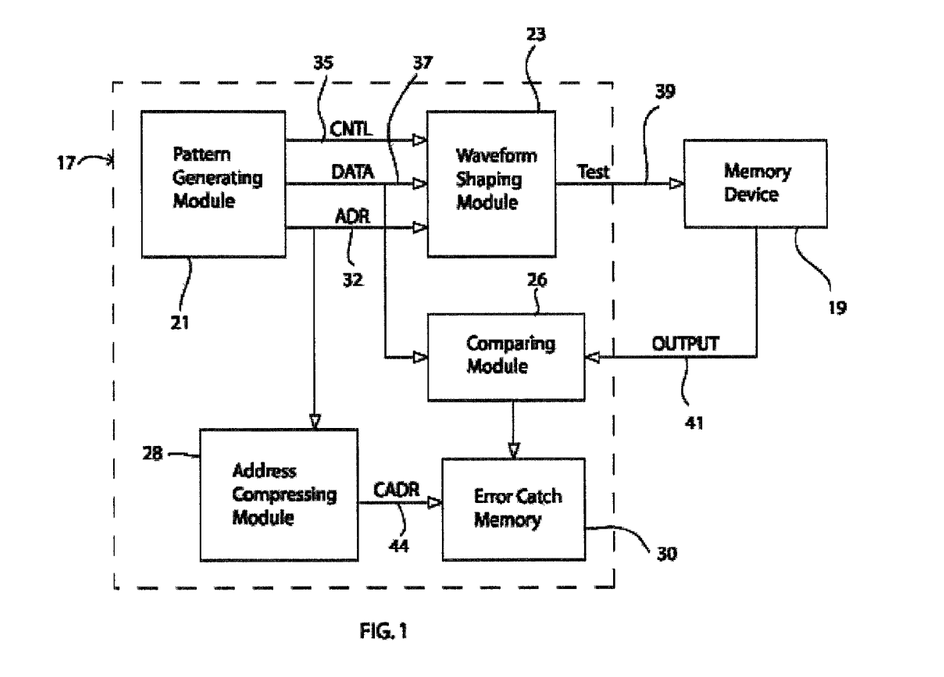
FIG. 1 is a block diagram illustrating a memory device connected to a memory testing apparatus.

Referring more particularly to the drawings, FIG. 1 illustrates a block diagram of a memory testing apparatus 17 in electrical communication with a memory under test (MUT) 19. The memory testing apparatus 17 comprises a pattern generating module 21, a waveform shaping module 23, a comparing module 26, an address compressing module 28, and an error catch memory 30.

An address signal (ADR) 32 and a control signal (CNTL) 35 are generated by the pattern-generating module 21, and advanced to the waveform-shaping module 23. A data signal (DATA) 37 is also supplied to the waveform-shaping module 23, the data signal 37 containing a plurality of "1"s and "0"s which, for example, can be written to the memory cells in the MUT 19 and later compared by the comparing module 26. Thus, in the illustrated embodiment the data signal 37 comprises an expected value, which is the standard data of the testing.

The waveform-shaping module 23 generates a test signal (TEST) 39 according to the address signal 32, data signal 37, and control signal 35. The test signal 39 is then applied to the MUT 19, and an output signal (OUTPUT) 41 is generated in response to the test signal 39 and transmitted from the MUT 19 to the comparing module 26. For instance, if the address signal 32 points to the area M1 64 (FIG. 4a), then the output data signal 41 can comprise or correspond to the contents stored in that area M1 64. In one embodiment, testing and other functions/structure disclosed in U.S. application Ser. No. 10/128,895, entitled Serial Input/Output Testing Method are used in connection with the present invention to the extent compatible and not mutually exclusive. The pattern-generating module 21 also advances a data signal 37 to the comparing module 26. The data signal 37 is then compared to the output signal 41 by the comparing module 26 to determine whether the addressed memory cell is functional or nonfunctional. For example, in one embodiment the memory area M1 64 comprises x bits (i.e., x memory cells) and the data signal 37 also comprises x bits of information, so that the data signal 37 is written to and read from the area M1 64, resulting in an output signal 41 comprising x bits. In this example, the x bit output signal 41 is compared bit-by-bit with the data signal 37 by the comparing module 26. For each bit of the output signal 41 during the comparison, a match between that bit and a corresponding bit of the data signal 37 indicates that the corresponding addressed memory cell (i.e., bit) is functional or a "pass," and a mismatch between that bit and the corresponding bit of the data signal 37 signifies a nonfunctional memory cell or a "fail." Once the bits of the output signal 41 are compared with the bits of the data signal 32, a comparing result is output from the comparing module 26 to the error catch memory 30, indicating whether the addressed memory area is functional or nonfunctional. In modified embodiments, the comparing module 26 compares the x bits in parallel rather than sequentially. As presently preferred, the value of x is greater than 1, but in a modified embodiment the value of x can be 1.

In addition to being advanced to the waveform shaping module 23, the address signal 32 is also conveyed to the address compressing module 28. This conveyance can occur substantially simultaneously with the address signal 32 being advanced to the waveform shaping module 23. After receiving the address signal 32, the address compressing module 28 generates a compressed address (CADR) 44 for the corresponding comparing result, wherein in the illustrated embodiment the compressed address 44 corresponds to the address or addresses of the memory cells being compared by the comparing module 26. Subsequently, the compressed address 44 is forwarded to the error catch memory 30. If for example, the comparing result is a "fail," then the compressed address 44 of the failed memory cell or cells is stored in the error catch memory 30. Thus, the address signal 32, pointing to the memory area having a failed cell or cells, is converted or mapped by the address compressing module 28 into a corresponding compressed address within the error catch memory. Information signifying a "fail" condition is thus placed into the error catch memory 30 at an address of the error catch memory 30 referred to as a compressed address. Accordingly, after testing of the memory device 19, information stored within the error catch memory 30 at the compressed addresses indicates areas of the memory device 19 which failed testing.

Figure 2:
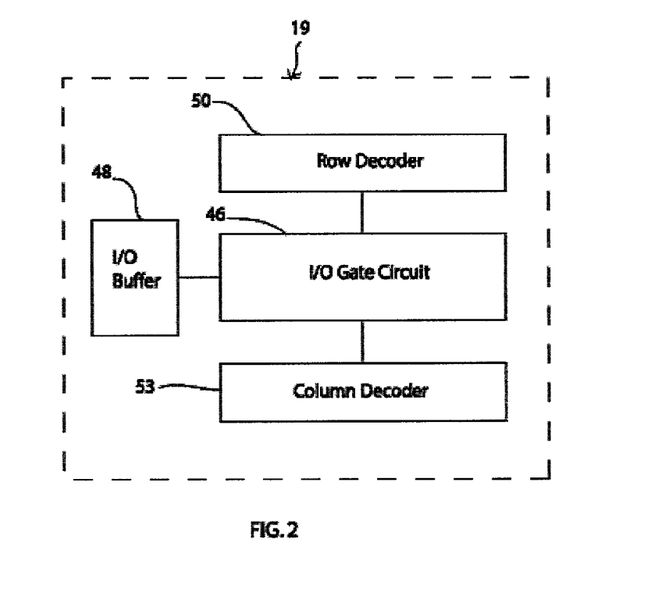
FIG. 2 is a block diagram illustrating functional components of the memory device.

FIG. 2 is a block diagram illustrating the major components of a memory device or MUT 19. An address signal 32, which may comprise a row address and a column address, is applied to the input/output (I/O) gate circuit 46 through the I/O buffer 48. In the illustrated embodiment, the row address from the address signal 32 supplied by the memory testing apparatus 17 is decoded by the row decoder 50, and activates a word line corresponding to the word address. The column address is likewise decoded by the column decoder 53. Thus, the desired memory cell, which is the beginning address of the memory area to be tested, is addressed within the MUT 19.

Figure 3:
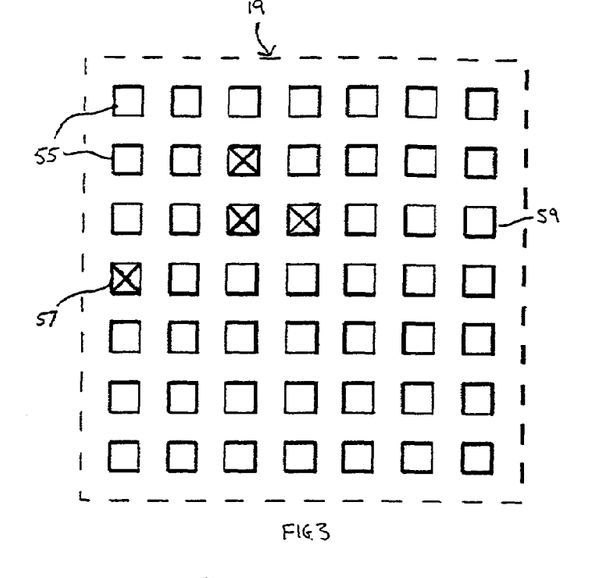
FIG. 3 is a block diagram depicting a plurality of memory cells of the memory device.

Referring to FIG. 3, an MUT 19 is divided into a plurality of memory cells 55, each of which is accessed by the appropriate row address and column address. Each of the plurality of memory cells 55 is a transistor that exists at the intersection of a word line and two bit lines, one bit line forming the drain of the memory cell and the other bit line forming the source. In FIG. 3, a functioning memory cell 59 is represented by an empty square, while a nonfunctional or failed memory cell 57 is represented by a square filled with an X.

Figure 4:
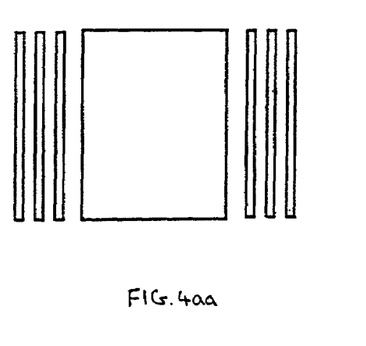
Figure 4A:
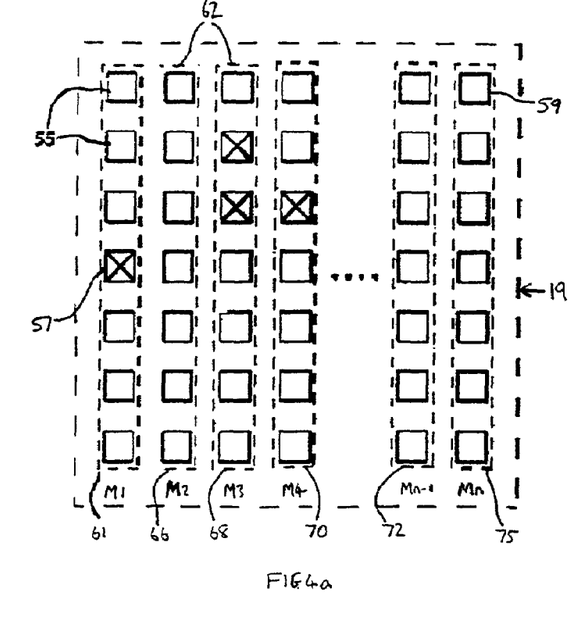
FIG. 4a is a data compression model for a redundancy column device.
Figure 4B:
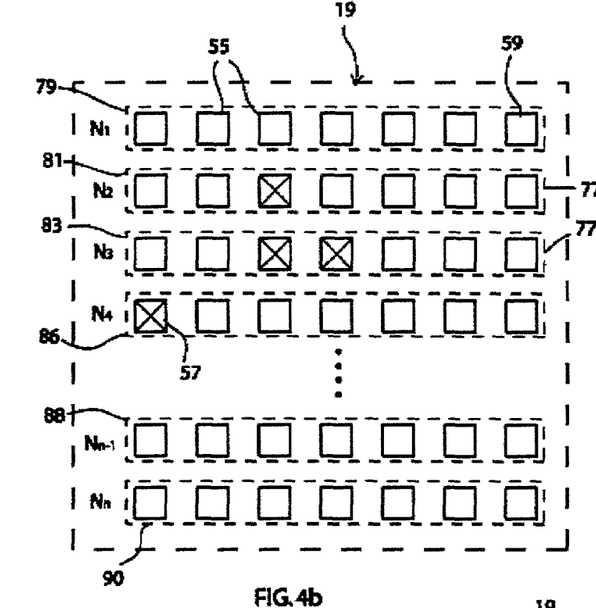
FIG. 4b is a data compression model for a redundancy row device.
Figure 4C:
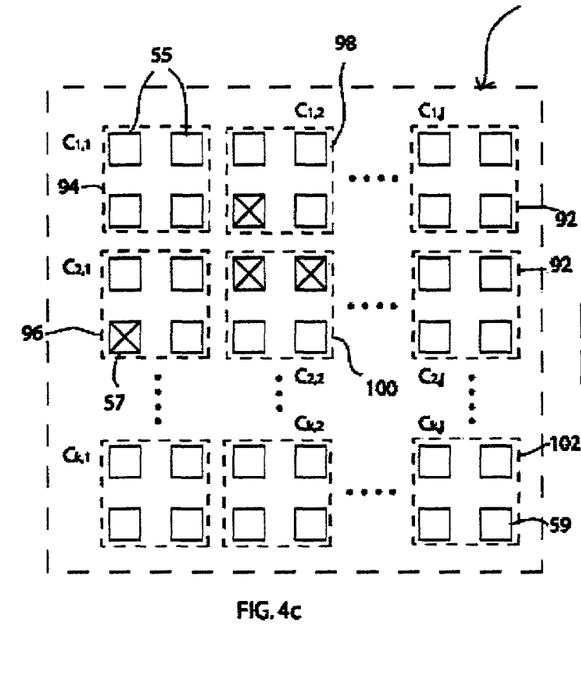
FIG. 4c is a data compression model for a redundancy block device.

In accordance with the present invention, the plurality of memory cells 55 are divided into a plurality of areas. Areas may take any form such as rows, columns, or blocks. FIG. 4a is a data compression model for a redundancy column device, and FIG. 4aa is a device diagram of such a redundancy column device. In FIG. 4a, the memory cells of an MUT 19 are divided into a plurality of column areas 62, designated as M1 64, M2 66, M3 68, M4 70, through Mn−1 72, Mn 75; and redundancy columns disposed on side areas of a main memory array are shown in the device memory arrangement of FIG. 4aa. FIG. 4b is a data compression model for a redundancy row device, wherein the redundancy row device comprises redundancy rows disposed on side areas of a main memory array as shown in the device diagram of FIG. 4bb. In FIG. 4b, the memory cells of an MUT 19 are divided into row areas, such as the illustrated row areas 77 designated as N1 79, N2 81, N3 83, N4 86, through Nn−1 88, Nn 90. FIG. 4c is a data compression model for a redundancy block device, and FIG. 4cc is a device diagram of such a redundancy block device wherein redundancy blocks are disposed on side areas of a main memory array. In FIG. 4c memory cells 55 are divided into a plurality of block areas 92, designated as C1,1 94, C2,1 96, C1,2 98, C2,2 100, through Ck,j 102. In a preferred embodiment, if any memory cells within an area fail, then the entire area is considered a "fail."

The error catch memory 30 of the memory test apparatus 17 (FIG. 1) comprises a plurality of memory bits, which are divided into a plurality of cell rows. In other embodiments, the error catch memory 30 is divided into columns, blocks, or other divisions, instead of cell rows. A cell row of the error catch memory 30 corresponds to the failed areas of a single MUT 19, wherein each memory bit of the cell row corresponds to a specific area such as a column area, a row area, or a block area of the MUT 19. In modified embodiments, other divisions of the catch memory (e.g., columns or blocks) can be implemented to denote failed areas of the memories under test.

Figure 5A:
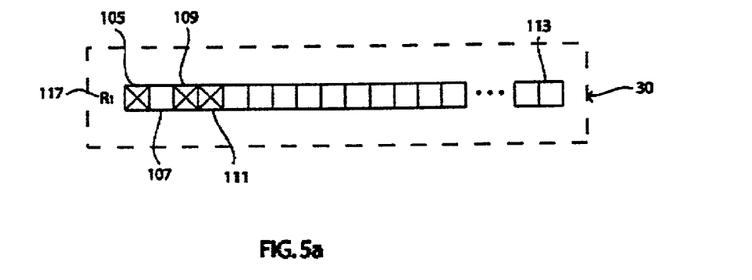
Figure 5B:
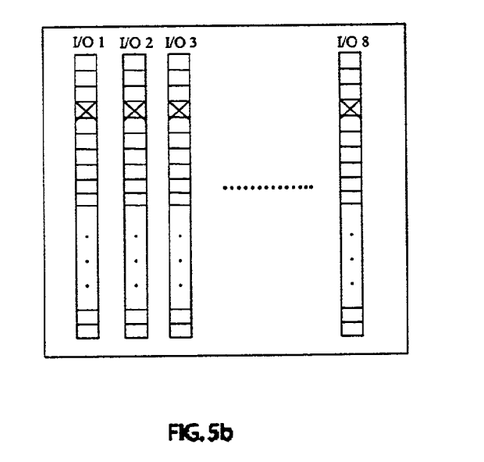
FIG. 5b is a block diagram illustrating columns of an error catch memory, the columns corresponding to I/O pins of the memory device of FIG. 4b.
Figure 5C:
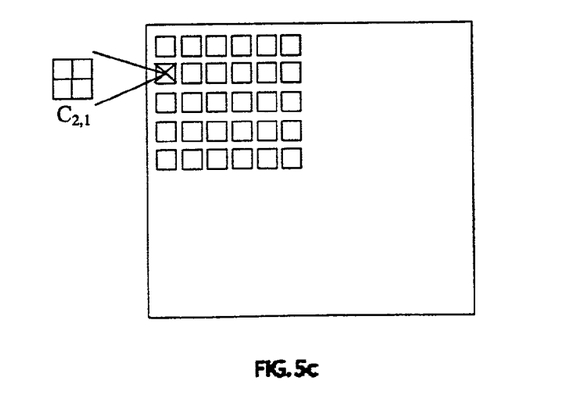
FIG. 5c is a block diagram illustrating blocks of an error catch memory, corresponding to the memory device of FIG. 4c.

FIGS. 5a, 5b, and 5c illustrate various implementations of the error catch memory. FIG. 5a corresponds to FIG. 4a, in which the plurality of memory cells 55 of the MUT 19 are divided into a plurality of column areas 62. Column area M1 64 contains a single failed memory cell, column area M2 66 contains no failed memory cells, column area M3 68 contains two failed memory cells, column area M4 70 contains 1 failed memory cell, and so forth. Correspondingly, the first bit 105 of cell row R1 117 of the error catch memory 30 is programmed as a "fail," the second bit 107 is a "pass" and is therefore not programmed, the third bit 109 is programmed as a "fail," the fourth bit 111 is programmed as a "fail," and the remaining bits through the nth cell 113 are "passes" and thus not programmed. In the illustrated embodiment, each row of the error catch memory 30 comprises a number of bits equal to, for example, the number of areas of the MUT assigned to that row. Accordingly, as presently embodied, bits at compressed addresses of the error catch memory 30 corresponding to failed areas are programmed (written to), while bits at compressed addresses corresponding to functional areas are not programmed. However, other protocols may be implemented to record the faulty areas of each MUT within the error catch memory 30. For instance, other mappings may be implemented to correlate the failed areas of the MUT to the bits of an assigned area of the error catch memory 30. As an example, bits at compressed addresses of the error catch memory 30 denoting functioning areas can be programmed, instead of the bits at compressed addresses denoting failed areas being programmed.

FIG. 5b corresponds to FIG. 4b, in which memory cells of the MUT are divided into row areas, such as row area N1 79 containing no failed memory cells, row area N2 81 containing a failed memory cell, etc. In the embodiment of FIG. 5b, the error catch memory for the MUT comprises y columns, wherein y is equal to a number of I/O pins of the MUT. In the embodiment of FIG. 5b, y is equal to 8 so that 8 columns of the error catch memory store compressed error data for 8 I/O pins of the MUT, but in other embodiments y may comprise other numbers, such as 16. The architecture is multiplied for multiple MUT testing implementations.

In another embodiment, in which memory cells of the MUT are divided into block areas 92 as shown in FIG. 4c, block area C1,1 94 contains no failed memory cells, block area C2,1 96 contains a single failed memory cell, block area C1,2 98 contains a failed memory cell, block area C2,2 100 contains two failed memory cells, and so on. Regarding FIG. 5c, the block corresponding in position to block area C1,1 94 would not be programmed, while the block corresponding in position to block area C2,1 96 would be programmed with a "fail" as shown. In the illustrated embodiment, each block of the error catch memory comprises 1 bit, so that each 4 bit block of error data is compressed to single bit of information in the error catch memory. Although a ¼ compression ratio is shown, other compression ratios are possible. The configuration is multiplied for multiple MUT testing.

In the illustrated embodiment, the memory testing apparatus 17 tests one area at a time, until all areas have undergone testing. When any memory cell in an area fails the test, that entire area is recorded as a "fail" in a corresponding bit of the error catch memory 30, and the memory testing apparatus 17 begins testing the subsequent area, terminating any further testing of the failed area. If a memory cell in an MUT fails, there is a much higher probability that the memory cells in the same row or column will also fail. Likewise, if a memory cell fails, there is a higher likelihood that neighboring memory cells will also fail. Therefore, to reduce test time without significantly decreasing test accuracy, not all of the memory cells in an MUT are tested, saving valuable test time. In one embodiment, testing of memory cells adjacent to failed memory cells is skipped, even if they are in adjacent columns, rows or blocks so that adjacent columns, rows or blocks are skipped. This embodiment can decrease testing time at the expense of generating a lower yield of functional memory cells of the MUT.

For example, to determine whether or not the column area M1 64 (FIG. 4a) is a "fail," the data stored in each memory cell of column area M1 64 is compared in sequence to a corresponding expected value. When a failed cell is detected (a mismatch occurs), the comparison is stopped for column area M1 64, and is begun for column area M2 66. Since column area M2 66 contains no failed memory cells, all of the cells within it are tested in succession. When all of the memory cells of column area M2 66 have been tested, the data stored in column area M3 68 is tested. Column area M3 68 contains two failed memory cells. Thus, when the first failed memory cell is detected, comparison of this column area terminates so that the second failed memory cell in the column area is not detected. Each of the remaining column areas is subsequently tested in succession. It is noted that the memory testing apparatus 17 operates substantially the same, whether column areas, row areas, block areas, or other area configurations are used.

Figure 6:
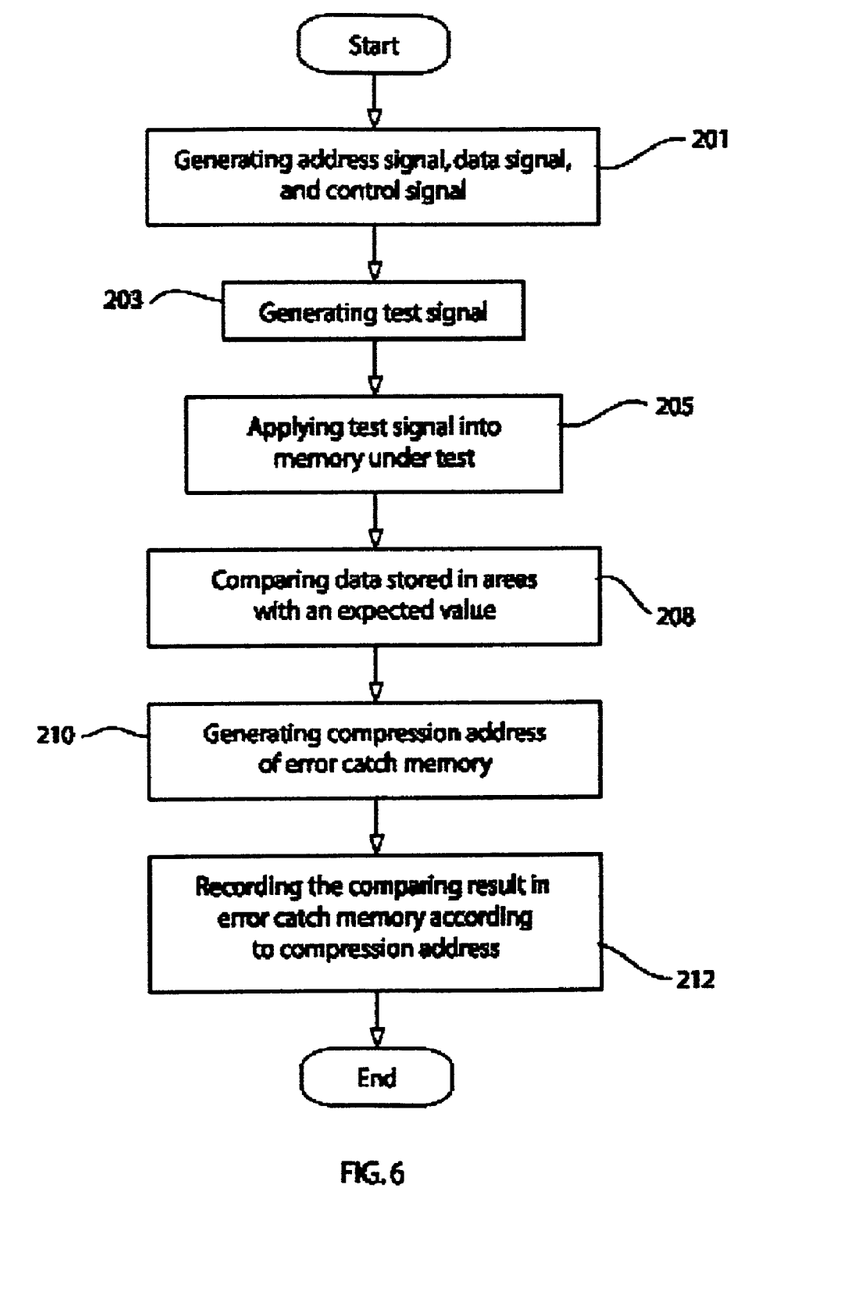
FIG. 6 is a flow chart representing the steps for testing a memory device in accordance with the present invention.

To further clarify the operation of the present invention, FIG. 6 depicts an exemplary flow chart illustrating the steps performed in a preferred embodiment to test an MUT 19. In step 201, the address signal 32, data signal 37, and control signal 35 are generated by the pattern generating module 21. The address signal 32 points to one area of the MUT 19, such as column area M1 64. In step 203, a test signal 39 is generated in the waveform shaping module 23 according to the address signal 32, data signal 37, and control signal 35. The test signal 39 is then applied to the MUT 19 in step 205, and an output signal 41 is subsequently forwarded from the MUT to the comparing module 26 of the memory testing apparatus 17. As an example, the data signal 37 comprises logical values (1 and 0), which along with the address signal 32 and control signal 35, make up the components of a test signal 39. The test signal 39 writes the logical values of the data signal 37 to the MUT 19, and the same logical values are compared to corresponding logical values which are outputted from the MUT 19 in the form of an output signal 41. In step 208, the output signal 41 of the data stored in the area currently under test is compared with the expected data signal 37 in the comparing module 26. The expected value may be stored in a data buffer memory (DBM). Each area is thus tested in succession, and when a failed memory cell is detected by the comparing module 26, testing of the current area is terminated, and testing begins for the subsequent area. For example, referring to FIG. 4a, the address signal 32 points to the areas M1 64 to Mn 75 in turn, so that the data stored in the areas M1 64 to Mn 75 is compared in turn. The comparing result of each of the areas M1 64 to Mn 75 is recorded in a corresponding bit in the error catch memory 30 to where a corresponding compressed address points. In other words, for example, a row of the error catch memory 30 is used to record the testing result of the memory under test MUT.

In step 210, a compressed address 44 is generated and advanced to the error catch memory 30. For example, the compressed address 44 points to one bit in a row R1 of the error catch memory 30. Step 212 completes the process of comparing a single area of an MUT 19 by storing the result of the compared area in the error catch memory 30 at a location denoted by the compressed address. As presently embodied, failed areas are programmed into the error catch memory 30, while areas that do not fail are not programmed. The process repeats and continues until all areas of the MUT 19 have been tested.

Figure 7:
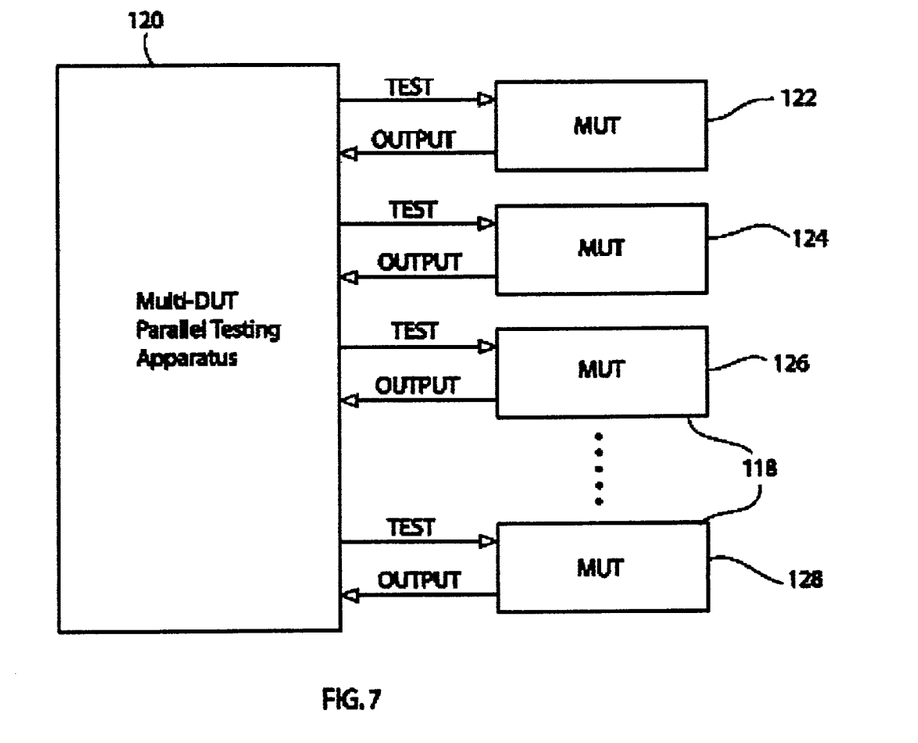
FIG. 7 is a block diagram of a Multi-DUT parallel testing apparatus connected to a plurality of memory devices.

Another embodiment of the present invention is shown in FIG. 7, wherein the memory testing apparatus is connected in parallel to a plurality of MUT 118. The memory testing apparatus, also referred to as a multi-devices-under-test (multi-DUT) parallel testing apparatus 120, is connected in parallel to a first MUT 122, a second MUT 124, a third MUT 126, through an nth MUT 128.

Figure 8:
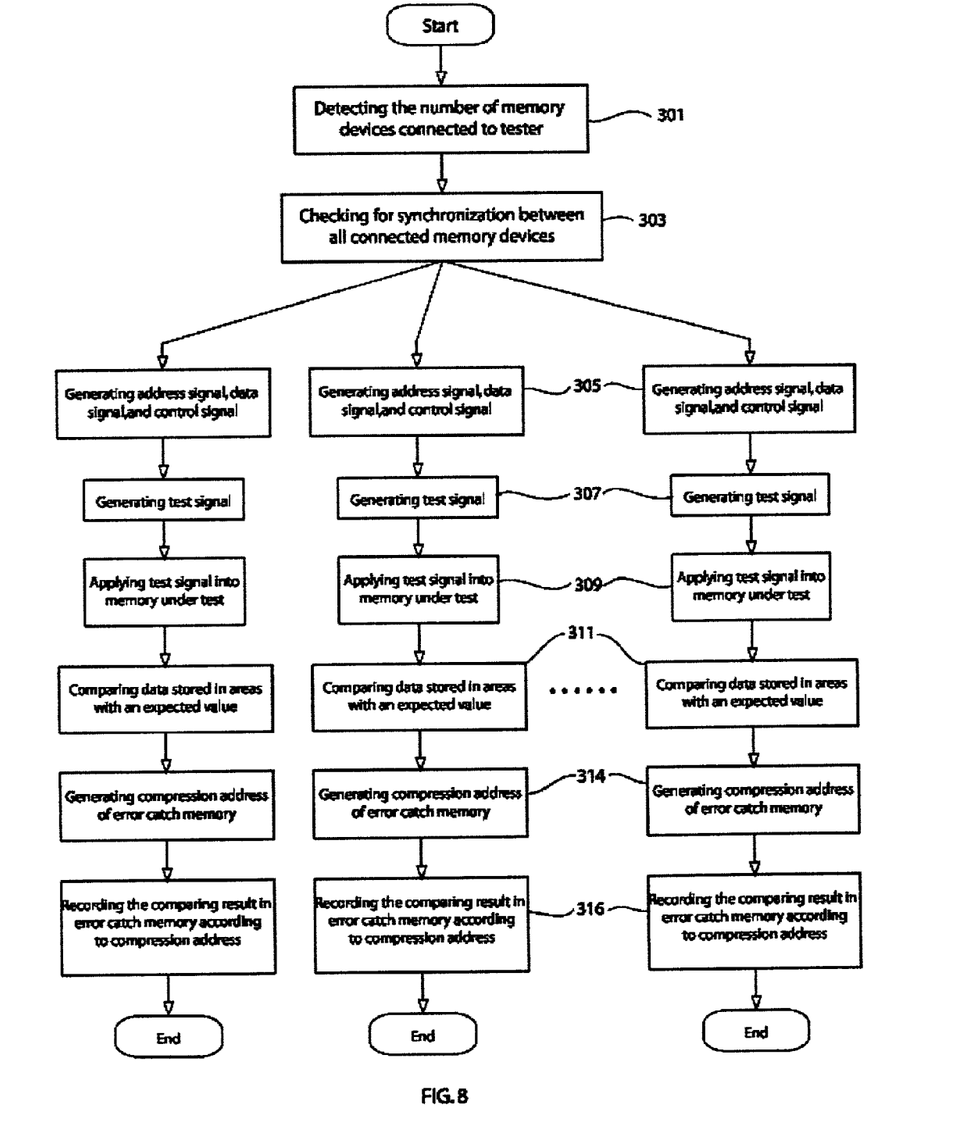
FIG. 8 is a flow chart representing the steps for testing a plurality of memory devices in accordance with an embodiment of the present invention.

FIG. 8 illustrates a process which can be implemented to test a plurality of MUT 118 in parallel. When testing a plurality of MUT 118 in parallel, the multi-DUT parallel testing apparatus 120 may begin by detecting the number of memory devices connected to it, at step 301. The method may then proceed by checking for synchronization between all connected memory devices, at step 303. Thereafter the pattern-generating module 21 generates and outputs a plurality of address signals 32, a plurality of data signals 37, and a plurality of control signals 35, at step 305. Each of the plurality of address signals 32 points to one area of a corresponding member of the plurality of MUT 118. In step 307, the waveform-shaping module 23 generates a plurality of test signals 39 according to the plurality of control signals 35, plurality of data signals 37, and plurality of address signals 32. In step 309, each of the plurality of test signals 39 is outputted to a corresponding member of the plurality of MUT 118. The comparing module 26 compares a corresponding expected value to a corresponding output signal 41 from a corresponding MUT 19, according to the test signal 39 applied to the MUT 19 for each of the plurality of MUT 118 in step 311. The comparing module 26 then outputs a plurality of comparison results to the error catch memory 30.

Figure 9:
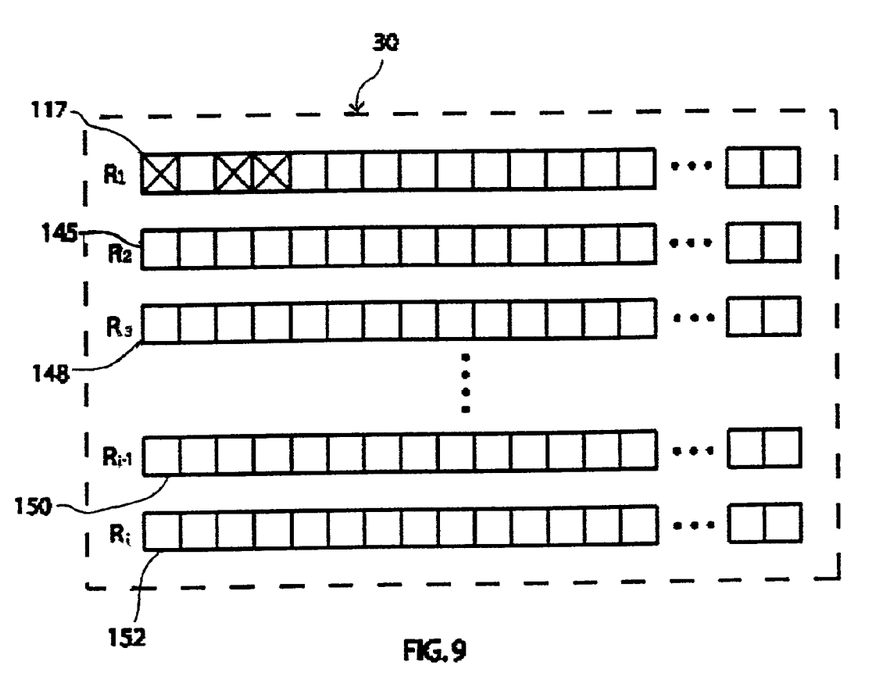
FIG. 9 is a block diagram illustrating the error catch memory divided into a plurality of cell rows.

In step 314, the address-compressing module 28 generates a plurality of compressed addresses for the results and advances them to the error catch memory 30. In step 316, compared values indicating failed areas are recorded in the error catch memory 30 according to the compressed addresses. FIG. 9 illustrates the error catch memory 30 with a plurality of bit rows, R1 117, R2 145, R3 148, through Ri−1 150, R1 152. In the illustrated embodiment, each of the bit rows corresponds to a single MUT 118, and has n bits, wherein each bit corresponds to an area (e.g., a cell, column or block) of a corresponding member of the plurality of MUT 118. For example, the results for one of the MUT are stored in a row R1 117, and the results for another of the MUT are stored in another row R2 145, and so on. Thus, an error catch memory 30 with 8000 rows can correspondingly store the locations of failed areas for 8000 MUT 118.

As described herein, the address of each memory area of an MUT corresponds (i.e., is mapped) to a bit within a row of the error catch memory. When a memory area of the MUT fails, the address of that memory area is converted to a new address (i.e., a compressed address pointing to a bit location) within the error catch memory. The conversion, which can occur based on the address of the MUT and the area rules being used, can be facilitated with for example a look-up table. After testing, to interpret how that compressed address in the error catch memory relates to an actual address of a memory area of the MUT, the tester simply refers back to the rules it used to define a memory area.

In connection with a simplified numerical example, an MUT having 32 bit addressing may comprise 4,294,967,296 bit locations (about 4 GB). Within the MUT, the addresses 00000000000000001, 00000000000000001 (row 1, col. 1), 00000000000000001, 00000000000000010 (row 1, col. 2), 00000000000000001, 00000000000000011 (row 1, col. 3) and 00000000000000001, 00000000000000100 (row 1, col. 4) are denoted here as areas A, B, C and D, respectively, within the MUT. When each area of the MUT is defined to have only one bit, the row of the error catch memory for storing test results of this MUT will have 4,294,967,296 bits. Now, if areas A and C of the MUT fail, the first 4 bits of the exemplary row of the error catch memory will be 1, 0, 1 and 0. A look up table can show that bit location 1 of that row of the error catch memory corresponds to row 1, col. 1 of the MUT and bit 3 of that row of the error catch memory corresponds to row 1, col. 3 of the MUT.

In a similar example, wherein each "area" of the MUT is 10 bits instead of 1 bit, the areas in the MUT can be grouped as follows: Area A: 00000000000000001, 00000000000000001 (row 1, col. 1) to 00000000000000001, 00000000000001010 (row 1, col. 10); Area B: 00000000000000001, 00000000000001011 (row 1, col. 11) to 00000000000000001, 00000000000010100 (row 1, col. 20); Area C: 00000000000000001, 00000000000010101 (row 1, col. 21) to 00000000000000001, 00000000000011110 (row 0, col. 30); and Area D: 00000000000000001, 00000000000011111 (row 1, col. 31) to 00000000000000001, 00000000000101001 (row 1, col. 40). Now, 42,949,672,960 bits of an MUT can be represented with the same row of the error catch memory.

In the illustrated embodiment, a row of the error catch memory comprises a number of bits equal to, for example, the number of memory areas of the MUT assigned to that row. Failed memory locations are indicated, for example, by logical is stored in corresponding bit locations of the assigned row of the error catch memory. Other mapping protocols, however, are also possible.

For example, instead of mapping the memory areas of an MUT to the bit locations of a row of an error catch memory, all of the memory areas of the MUT can be consecutively "numbered" (or otherwise labeled with indicia besides their actual addresses), and the assigned "numbers" of the failed areas of the MUT can be recorded in an error catch memory. This alternative embodiment corresponds to a protocol wherein the number of bits in a row of the error catch memory can be less than the number of areas in the MUT corresponding to that row. In this case, the number of bits in the row need only be as great as that needed to record the assigned "numbers" of failed memory areas that might occur within the assigned MUT. For example, a 42 GB MUT can be divided into areas of 10 bits each, so that the memory is divided into 4.2 billion areas. These areas are consecutively "numbered" (mapped) from "area 1" to "area 4.2 billion." Thus, bits 1 to 10 of the MUT are mapped as area 1, bits 11–20 are mapped as area 2, bits 21–30 are mapped as area 3, and so on. If, hypothetically, only bits 8 and 26 of an MUT fail, then the corresponding row for that error catch memory stores only the numbers "1" and "3" as compared to storing binary 1s in bits 1 and 3 of a row of an error catch memory consisting of 4.2 billion bits. That is, 64 bits can be used instead of 4.2 billion bits to store the numbers "1" and "3", resulting in the same information being stored.

In view of the foregoing, it will be understood by those skilled in the art that the methods and apparatuses of the present invention can facilitate the testing of memory devices. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A memory testing apparatus for testing a plurality of areas of memory cells of a first memory device and a second memory device, comprising:
   a waveform-shaping module configured to generate a plurality of test signals according to a plurality of address signals and to output each of the plurality of test signals to one of the memory devices;
   a comparing module configured to compare expected values corresponding to the test signals with output signals from corresponding memory devices of the first memory device and the second memory device in response to the plurality often signals, and to output a plurality of comparison results;
   an address-compressing module configured to generate compressed addresses for the plurality of comparison results; and
   an error catch memory configured to record outputted comparison results for both the first memory device and the second memory device in a corresponding plurality of consecutive divisions of the error catch memory according to a corresponding plurality of the compressed addresses for the first memory device and the second memory device, each of the outputted comparison results being stored as a single bit;
   wherein the memory testing apparatus is configured to test all areas of the plurality of areas and not to test all memory cells in a given area when any comparison result is indicative of a failed memory cell in that area.

2. The memory testing apparatus of claim 1, wherein the compressed address points to a bit of the error catch memory.

3. The memory testing apparatus of claim 1, wherein:
   the test signal comprises a data signal;
   the output signal corresponds to an area of the memory device that was written with the data signal and then read from; and
   the compressed address maps the area of the memory device to an area of the error catch memory.

4. The memory testing apparatus of claim 3, wherein:
   the area of the memory device comprises a plurality of bits; and
   the area of the error catch memory is one bit.

5. The memory testing apparatus of claim 1, wherein:
   the compressed address maps an area of the memory device to an area of the error catch memory; and
   the area of the memory device is greater than the area of the error catch memory.

6. The memory testing apparatus of claim 5, wherein:
   the area of the memory device comprises a plurality of bits; and
   the area of the error catch memory is one bit.

7. The memory testing apparatus of claim 1, wherein:
   the test signal comprises a data signal which is equal to the expected value;
   a number of bits of the data signal is equal to a number of bits of the output signal; and
   the comparing module is configured to sequentially compare bits of the output signal with corresponding bits of the expected value, the comparing module being configured to stop comparing the bits of the output signal and the expected value when a mismatch is detected between a bit of the output signal and a corresponding bit of the expected value, the mismatch indicating a failed memory location of the memory device.

8. The memory resting apparatus of claim 1, wherein the error catch memory is configured to record the comparison result in a memory location of the error catch memory according to the compressed address only when the comparison result is indicative of a mismatch between the output signal and the expected value.

9. The memory testing apparatus of claim 1, wherein:
   the test signal includes the expected value;
   the address compressing module uses the address signal to generate the compressed address;
   the memory testing apparatus further comprises a pattern-generating module that is configured to generate and output the address signal and the expected value;
   the address signal points to a cell area of the memory device;
   when one or more bits of the expected value and the output signal are mismatched, the comparing module stops comparing and outputs the comparison result as a "fail"; and
   when the expected value and the corresponding output signal are matched, the comparing module outputs the comparison result as a "pass."

10. The memory testing apparatus of claim 1, wherein the memory testing apparatus is configured not to test all memory cells in a given area, and to skip testing of memory cells in an adjacent area, when any comparison result is indicative of a failed memory cell in the given area.

11. A memory testing apparatus for testing a plurality of areas of memory cells of at least one memory device, comprising:
   a waveform-shaping module configured to generate a test signal according to an address signal and to output the test signal to the memory device;
   a comparing module configured to compare an expected value with an output signal received from the memory device in response to the test signal, and to output a comparison result;
   an address-compressing module configured to generate a compressed address for the comparison result; and
   an error catch memory configured to record the comparison result in a memory location of the error catch memory according to the compressed address;
   wherein the memory testing apparatus is configured to test all areas of the plurality of areas and not to rest all memory cells in a given area upon a comparison result is indicative of a failed memory cell in that area;
   wherein the at least one memory device includes a first memory device and a second memory device; and
   wherein the error catch memory comprises a plurality of consecutive divisions, each division storing comparison results indicative of failed areas of a given one of the memory devices and each comparison result being stored as a single bit.

12. A memory testing apparatus for testing a plurality of areas of memory locations of a first memory device and a second memory device, the memory testing apparatus testing the first and second memory devices in parallel and comprising:
a waveform-shaping module configured to generate a plurality of test signals, the test signals comprising a plurality of address signals and a plurality of expected values, each of the plurality of address signals pointing to an area of a corresponding one of the memory devices, the waveform-shaping module further being configured to output a the test signals to the memory devices in parallel so that the memory devices are tested in parallel; and
a comparing module configured to sequentially compare bits of output signals, received from the memory devices in response to the test signals, with corresponding bits of expected values, the comparing module being configured to output comparison results and further being configured to stop comparing the bits of the output signals and the expected values when a any mismatch is detected between a bit of an output signal and a corresponding bit of an expected value, the mismatch indicating a failed memory location of a memory device;
wherein the comparing module is configured to compare the expected values with output signals from the memory devices, which are received from the memory devices in response to the test signals, and the comparing module being configured to output comparison results;
wherein the memory testing apparatus further comprises an address-compressing module that is configured to generate compressed addresses for the comparison results, using corresponding address signals; and
wherein the memory testing apparatus further comprises an error catch memory that is configured to receive comparison results for the memory devices and record tern in a plurality of consecutive divisions of the error catch memory according to a corresponding plurality of the compressed addresses, each division storing comparison results indicative of failed areas of a given one of the memory devices and each of the comparison results being stored as a single bit.

13. The memory testing apparatus of claim 12, wherein, following detection of a mismatch, the waveform-shaping module outputs another test signal to the memory device, and the comparing module sequentially compares bits of another output signal, received from the memory device in response to the other test signal, with corresponding bits of another expected value.

14. The memory testing apparatus of claim 13, wherein:
the test signal includes an address signal tat points to a cell area of the memory device; and
following the detection of a mismatch, the address signal is changed to point to another cell area of the memory device.

15. The memory testing apparatus of claim 14, wherein:
the comparing module is configured to output a comparison result upon detection of a mismatch; and
the memory testing apparatus further comprises:
(a) an address-compressing module configured to generate a compressed address for the comparison result; and (b) an error catch memory configured to record the comparison result in a memory location of the error catch memory according to the compressed address.

16. The memory testing apparatus of claim 15, wherein:
the compressed address points to a bit of the error catch memory; and
the comparison result is stored in the bit of the error catch memory.

17. The memory testing apparatus of claim 16, wherein:
the memory device comprises a plurality of cell areas, with each cell area comprising a plurality of bits; and
a number of bits of the expected value is equal to a number of bits of the output signal.

18. The memory testing apparatus of claim 12, wherein the memory testing apparatus is configured not to test all memory locations in a given area of the plurality of areas, and to skip testing of memory locations in an adjacent area of the plurality of areas, upon any detection of a mismatch indicative of a failed memory location in the given area.

19. A memory testing method for testing a plurality of areas of memory cells of a first memory device and a second memory device, comprising:
generating a plurality of test signals according to a plurality of address signals;
outputting in a parallel fashion each of the plurality of test signals to the memory devices so that the memory devices are tested in parallel;
comparing expected values corresponding to the test signals with output signals from corresponding memory devices in response to the test signals;
outputting comparison results corresponding to the memory devices;
generating compressed addresses for the comparison results; and
recording the comparison results for the memory devices in consecutive divisions of an error catch memory according to the compressed addresses, each division storing comparison results indicative of failed areas of a given one of the memory devices and each comparison result being stored as a single bit wherein all areas of the plurality of areas are tested but not all memory cells in a given area are tested upon any occurrence of a comparison result indicative of a failed memory cell in that area.

20. The memory testing method of claim 19, wherein
the test signal comprises a data signal;
the output signal corresponds to an area of the memory device that was written with the data signal and then read from; and
the compressed address maps the area of the memory device to an area of the error catch memory, which is smaller than the area of the memory device.

21. The memory testing method of claim 19, wherein:
the test signal comprises a data signal which is equal to the expected value;
a number of bits of the data signal is equal to a number of bits of the output signal; and
the comparing includes sequentially comparing bits of the output signal with corresponding bits of the expected value, until (1) all bits of the output signal have been compared or (2) a mismatch is detected between a bit of the output signal and a corresponding bit of the expected value, the mismatch indicating a failed memory location of the memory device.

22. The memory testing method of claim 19, wherein the error catch memory records the comparison result in a memory location of the error catch memory according to the compressed address only when the comparison result is indicative of a mismatch between the output signal and the expected value.

23. The memory resting method of claim 19, wherein:
the test signal includes the expected value;
the address signal is used to generate the compressed address;
the address signal points to a cell area of the memory device;
when the expected value and the corresponding output signal are mismatched, the comparing stops and a "fail" comparison result is outputted; and
when the expected value and the corresponding output signal are matched, a "pass" comparison result is outputted.

24. The memory testing method of claim 19, wherein testing of memory cells in an area adjacent to the given area is skipped upon any occurrence of a comparison result indicative of a failed memory cell in the given area.

25. A memory testing method for testing a plurality of areas of memory locations of a plurality of memory devices, wherein the plurality of memory devices are tested in parallel, the memory testing method comprising:
generating a plurality of test signals, the test signals comprising a plurality of address signals and a plurality of expected values, each of the plurality of address signals pointing to an area of a corresponding one of the memory devices;
outputting in parallel the test signals to the memory devices;
sequentially comparing bits of output signals, received from each of the memory devices in response to the test signals, with corresponding bits of expected values, the comparing of bits of the output signals and the expected values being halted for any one of the memory devices being tested in parallel when any occurrence of a mismatch is detected between a bit of an output signal and a corresponding bit of an expected value, the mismatch indicating a failed memory location of the corresponding memory device; and
recording comparison results for the memory devices in a corresponding plurality of memory locations of an error catch memory, wherein the error catch memory comprises a plurality of consecutive divisions, each division storing comparison results indicative of failed areas of a given one of the memory devices and each comparison result being stored as a single bit.

26. The memory testing method of claim 25, wherein following detection of a mismatch, another test signal is outputted to the memory device, and bits of another output signal, which is received from the memory device in response to the other test signal, are sequentially compared with corresponding bits of another expected value.

27. The memory testing method of claim 26, and further comprising:
outputting a comparison result upon detection of a mismatch;
generating a compressed address for the comparison result; and
recording the comparison result in a memory location of an error catch memory according to the compressed address.

28. The memory testing method of claim 27, wherein:
the memory device comprises a plurality of cell areas, with each cell area comprising a plurality of bits;
the compressed address points to a bit of the error catch memory; and
the comparison result is stored in the bit of the error catch memory.

29. The memory testing method of claim 25, wherein the at least one memory device includes a first memory device and a second memory device, and wherein:
the comparing is followed with outputting comparison results;
the memory testing method includes generating compressed addresses for the comparison results, using corresponding address signals; and
the memory testing method further includes recording comparison results fur the first memory device and the second memory device in a corresponding plurality of memory locations of an error catch memory according to a corresponding plurality of the compressed addresses.

30. The memory testing method of claim 25, wherein:
the mismatch indicates a failed memory location of a given area of the memory device; and
testing of memory locations in an area adjacent to the given area is skipped upon any detection of a mismatch indicative of a failed memory location in the given area.

* * * * *